(12) United States Patent
Chung et al.

(10) Patent No.: US 12,237,218 B2
(45) Date of Patent: Feb. 25, 2025

(54) METHOD OF FABRICATING CONTACT STRUCTURE

(71) Applicant: Taiwan Semiconductor Manufacturing Company, Ltd., Hsinchu (TW)

(72) Inventors: Chang-Ting Chung, Taipei (TW); Shih-Wei Yeh, Hsinchu (TW); Kai-Chieh Yang, New Taipei (TW); Yu-Ting Wen, Taichung (TW); Yu-Chen Ko, Chiayi (TW); Ya-Yi Cheng, Taichung (TW); Min-Hsiu Hung, Tainan (TW); Chun-Hsien Huang, Hsinchu (TW); Wei-Jung Lin, Hsinchu (TW); Chih-Wei Chang, Hsinchu (TW); Ming-Hsing Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 389 days.

(21) Appl. No.: 17/738,009

(22) Filed: May 6, 2022

(65) Prior Publication Data

US 2023/0360969 A1    Nov. 9, 2023

(51) Int. Cl.
*H01L 21/768*    (2006.01)
*H01L 21/3213*    (2006.01)
*H01L 29/40*    (2006.01)
*H01L 29/45*    (2006.01)
*H10B 10/00*    (2023.01)

(52) U.S. Cl.
CPC .. *H01L 21/76865* (2013.01); *H01L 21/32133* (2013.01); *H01L 21/32138* (2013.01); *H01L 21/76846* (2013.01); *H01L 21/76877* (2013.01); *H01L 29/401* (2013.01); *H10B 10/12* (2023.02); *H01L 29/456* (2013.01)

(58) Field of Classification Search
CPC ........... H01L 21/3213; H01L 21/32133; H01L 21/32135; H01L 21/32115; H01L 21/76865; H01L 21/76883; H01L 21/76886; H01L 21/76888
See application file for complete search history.

(56) References Cited

U.S. PATENT DOCUMENTS 6,720,248 B2 *    4/2004    Ryo    ................. H01L 21/76864
                                                                      257/E21.585
9,899,258 B1 *    2/2018    Wu    ................. H01L 21/76843

* cited by examiner

Primary Examiner — David A Zarneke
(74) Attorney, Agent, or Firm — JCIPRNET

(57) ABSTRACT

A method of fabricating a contact structure includes the following steps. An opening is formed in a dielectric layer. A conductive material layer is formed within the opening and on the dielectric layer, wherein the conductive material layer includes a bottom section having a first thickness and a top section having a second thickness, the second thickness is greater than the first thickness. A first treatment is performed on the conductive material layer to form a first oxide layer on the bottom section and on the top section of the conductive material layer. A second treatment is performed to remove at least portions of the first oxide layer and at least portions of the conductive material layer, wherein after performing the second treatment, the bottom section and the top section of the conductive material layer have substantially equal thickness.

15 Claims, 15 Drawing Sheets

METHOD OF FABRICATING CONTACT STRUCTURE

BACKGROUND

Semiconductor devices are used in a variety of electronic applications, such as personal computers, cell phones, digital cameras, and other electronic equipment, as examples. Generally, a typical semiconductor device includes a substrate having active devices such as transistors and capacitors. These active devices are initially isolated from each other, and interconnect structures are subsequently formed over the active devices to create functional circuits. Such interconnect structures may include contact structures, which may be electrically coupled to the active devices on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
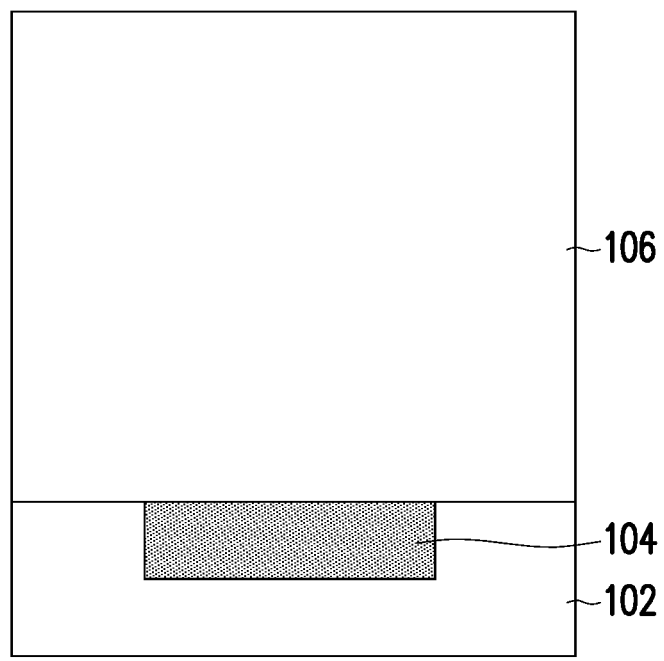
FIG. 1A to FIG. 1N are schematic sectional views of various stages in a method of fabricating a contact structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the manufacture of semiconductor devices, conductive materials are used for filling openings in dielectric layers to form conductive elements such as contact structures or contact plugs. However, due to the scaling down of feature sizes, the filling of small openings has become more difficult. As such, damaged contact structures or contact plugs are usually formed, and the formed contact structures or contact plugs have high resistance and yield loss issues. In some embodiments of the present disclosure, a method of fabricating a contact structure (or contact plug) having lower resistance with more reliable electrical connection is described.

Figure 1B:
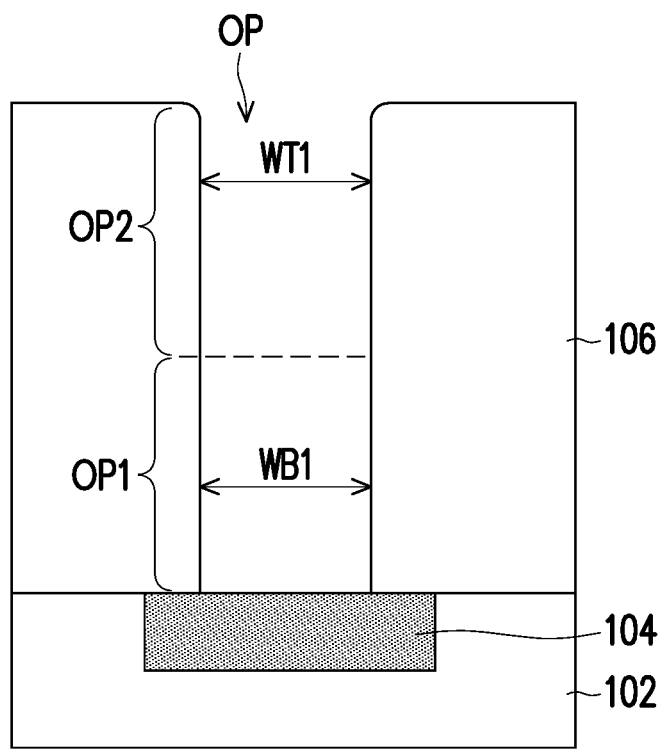
Figure 1C:
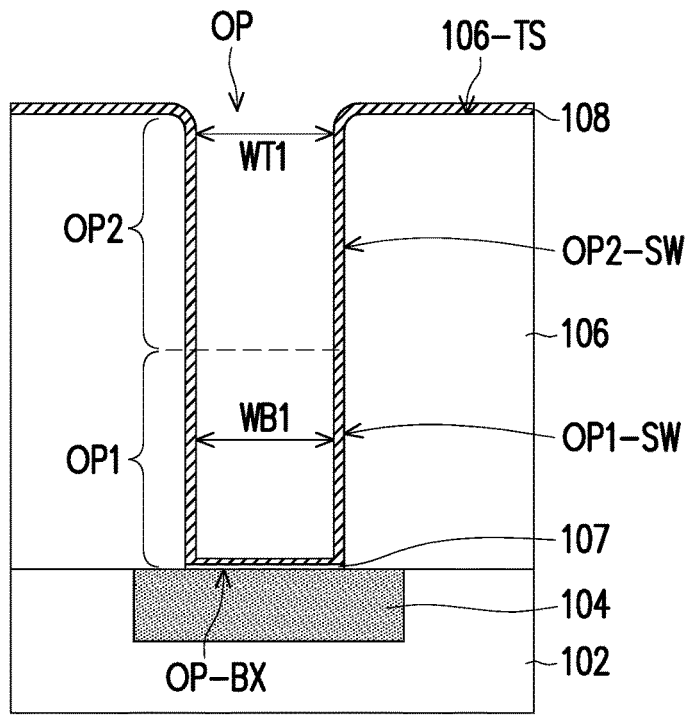
Figure 1D:
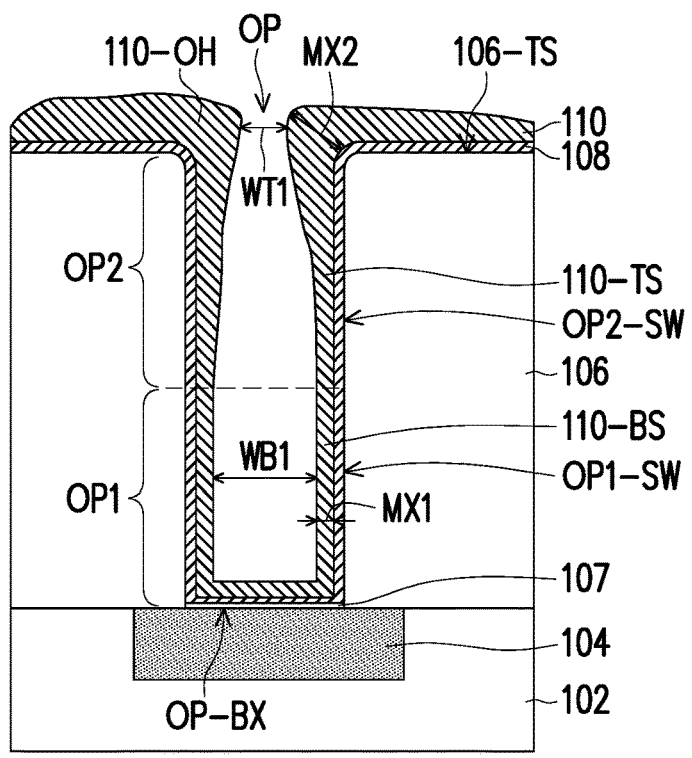
Figure 1E:
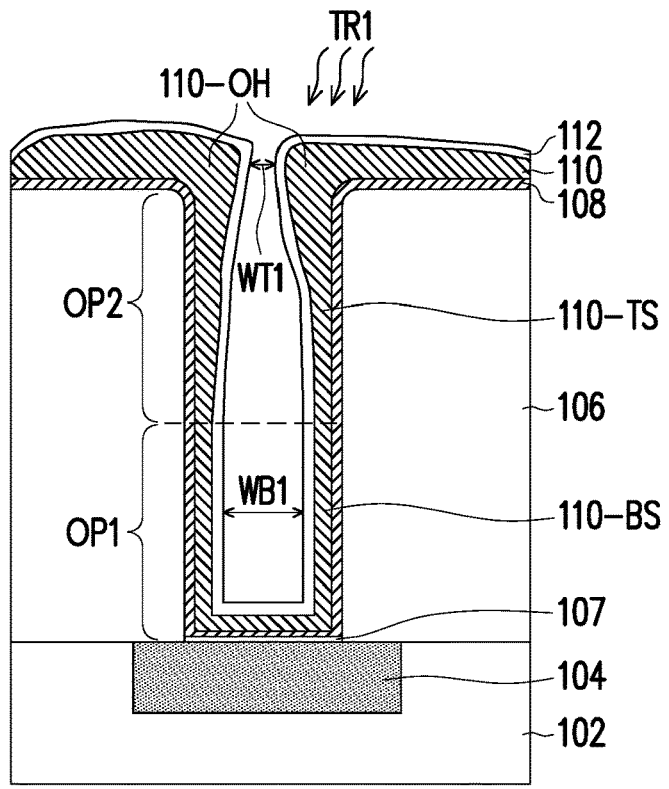
Figure 1F:
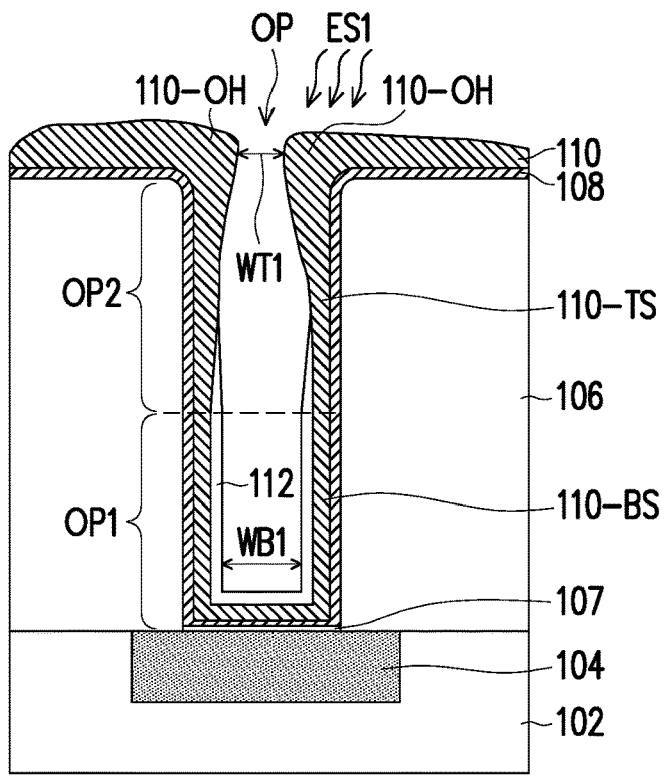
Figure 1G:
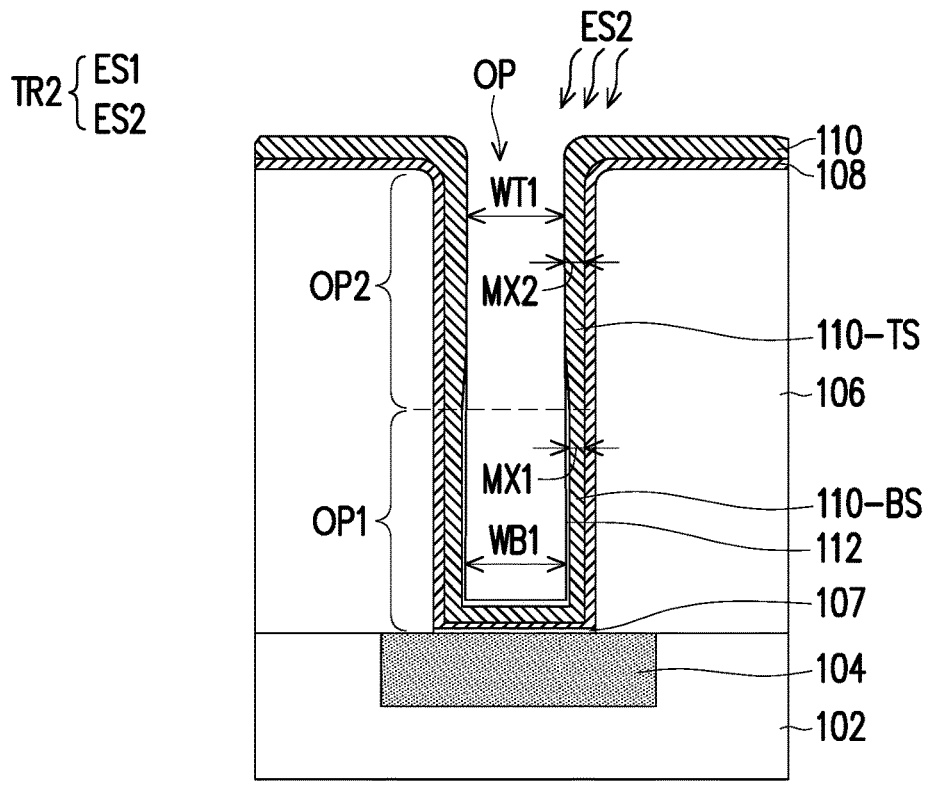
Figure 1H:
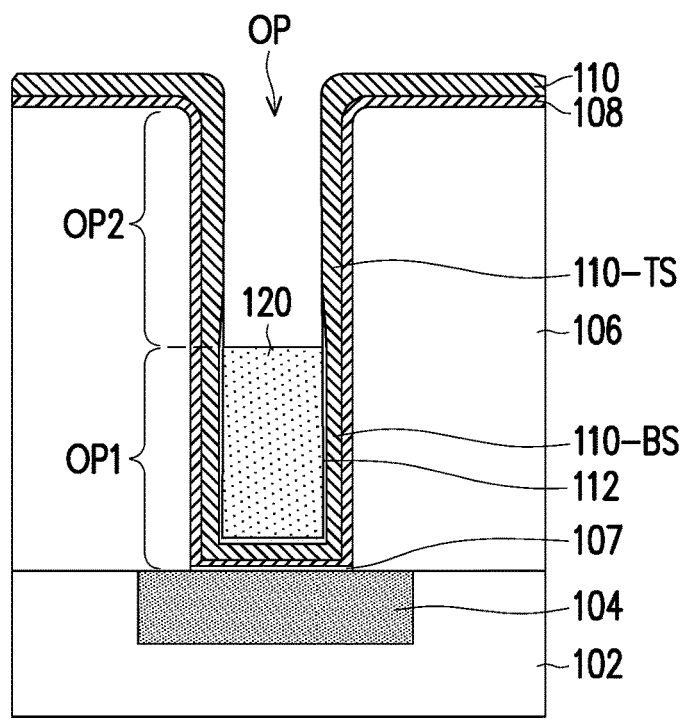
Figure 1I:
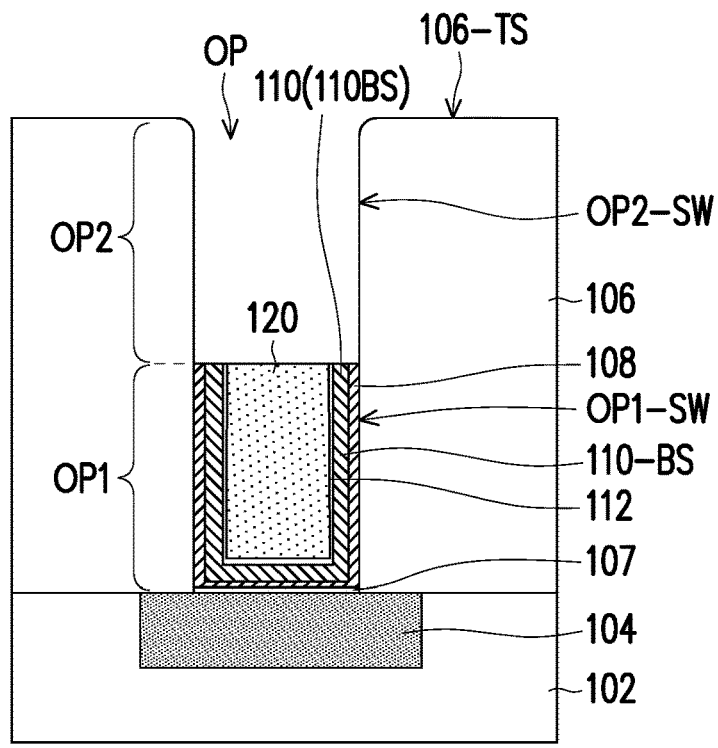
Figure 1J:
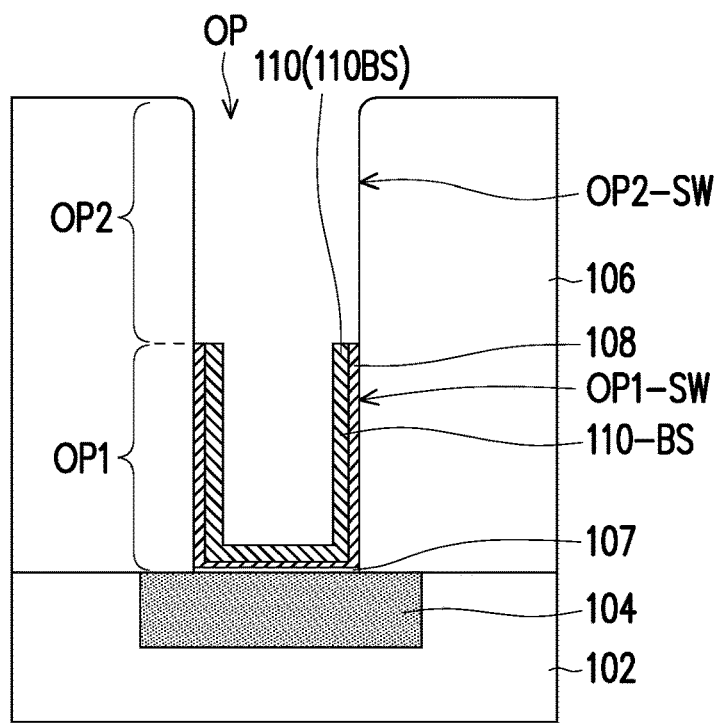
Figure 1K:
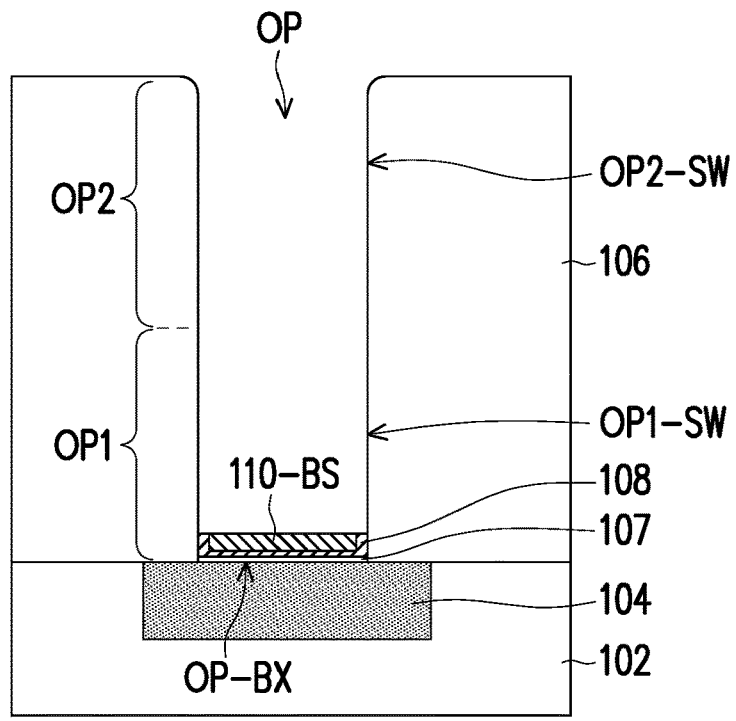
Figure 1L:
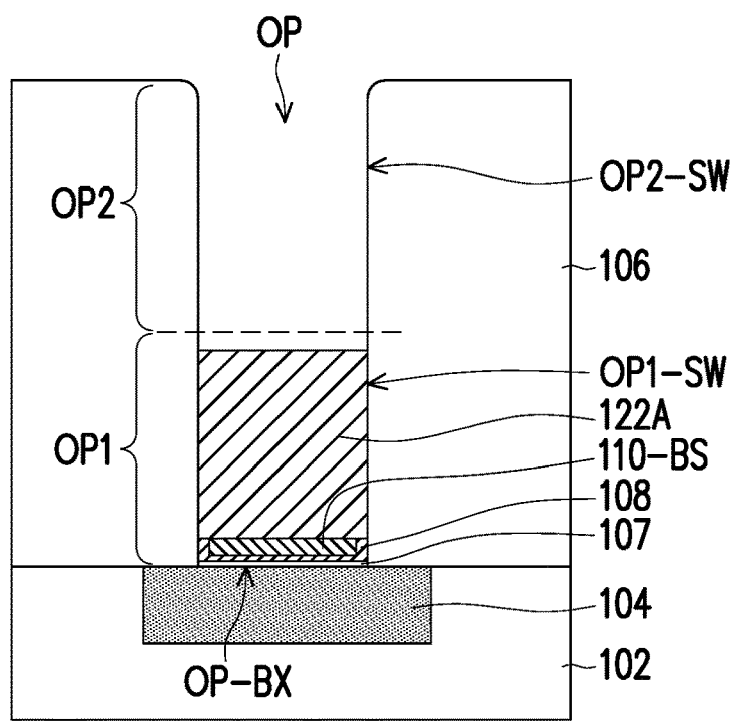
Figure 1M:
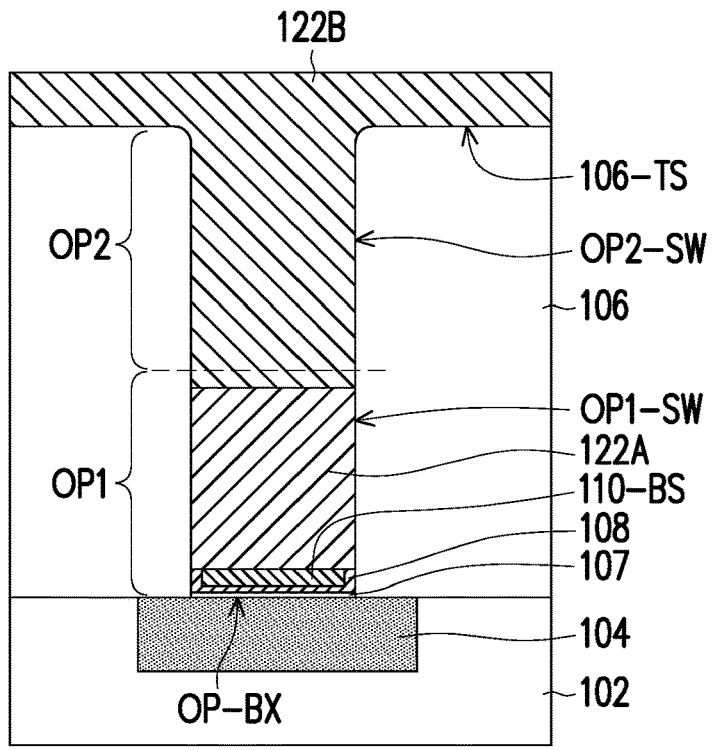
Figure 1N:
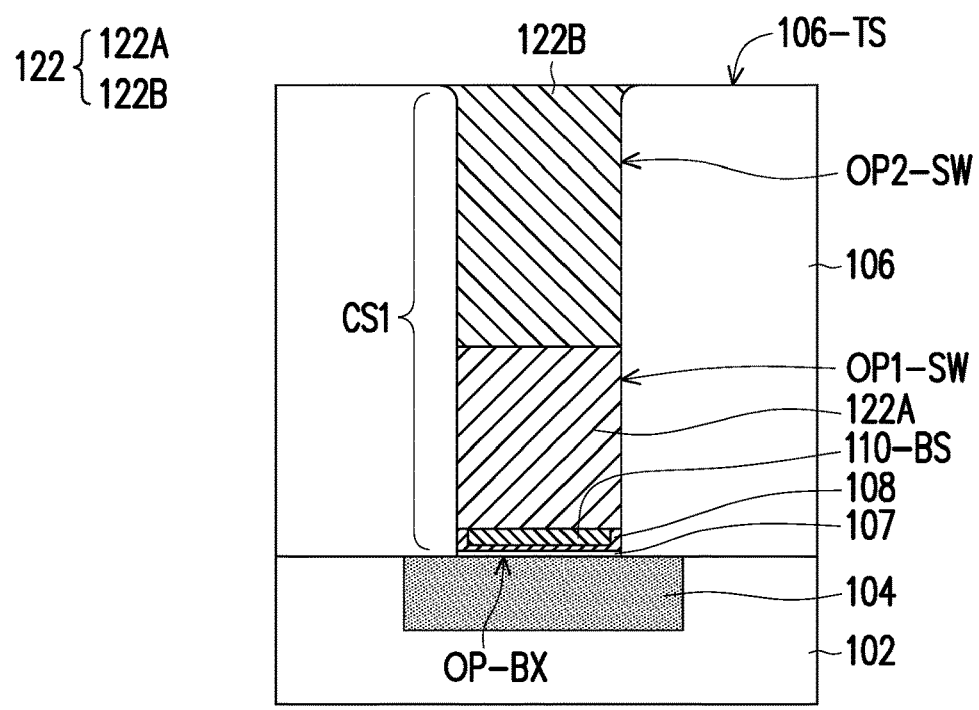

FIG. 1A to FIG. 1N are schematic sectional views of various stages in a method of fabricating a contact structure according to some exemplary embodiments of the present disclosure. Referring to FIG. 1A, a substrate 102 is provided. The substrate 102 may be a semiconductor wafer, such as a silicon wafer, or the like. In some embodiments, the substrate 102 may include active and/or passive devices embedded therein. In some embodiments, the substrate 102 includes a semiconductor region 104. For example, the semiconductor region 104 may be an epitaxial semiconductor region of a source/drain region of a transistor. The semiconductor region 104 include materials such as silicon or silicon-germanium. In some embodiments, an epitaxy or epitaxial (epi) process may be used to form the semiconductor region 104. For example, a selective epitaxy growth (SEG) process, chemical vapor deposition (CVD) techniques (e.g., vapor-phase epitaxy (VPE) and/or ultra-high vacuum CVD (UHV-CVD)), molecular beam epitaxy, other suitable epi processes may be performed to form the semiconductor region 104. In some embodiments, the semiconductor region 104 is exposed to an annealing process, such as a rapid thermal annealing process, or the like.

As further illustrated in FIG. 1A, a dielectric layer 106 (or interlayer dielectric) is formed on the substrate 102. The dielectric layer 106 may be formed of nitrides such as silicon nitride, oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. Furthermore, the dielectric layer 106 may be deposited by chemical vapor deposition (CVD), physical vapor deposition (PVD), atomic layer deposition (ALD), a spin-on-dielectric (SOD) process, the like, or a combination thereof. In some embodiments, the dielectric layer 106 is formed on the substrate 102 to cover the surface of the substrate 102 and to cover the semiconductor region 104.

Referring to FIG. 1B, in a subsequent step, the dielectric layer 106 is patterned to form an opening OP (or trench). For example, the opening OP reveals the semiconductor region 104 on the substrate 102. In some embodiments, the opening OP has a bottom opening portion OP1 and a top opening portion OP2. For example, the bottom opening portion OP1 and the top opening portion OP2 are respectively a bottom half and a top half of the opening OP. In other words, the bottom opening portion OP1 and the top opening portion OP2 may have substantially equal heights. In some embodiments, the opening OP has a bottom opening width WB1 and a top opening width WT1. For example, the bottom opening width WB1 is substantially equal to the top opening width WT1. In some other embodiments, the top opening width WT1 may be slightly greater than the bottom opening width WB1.

Referring to FIG. 1C, a liner layer 108 is conformally formed over the dielectric layer 106 and within the opening OP. For example, the liner layer 108 is formed along a top surface 106-TS of the dielectric layer 106, and formed along sidewalls (e.g. bottom sidewalls OP1-SW and top sidewalls OP2-SW) and a bottom surface OP-BX of the opening OP. The liner layer 108 may have a constant thickness across the sidewalls and bottom surface OP-BX of the opening OP. In some embodiments, the liner layer 108 may include tantalum (Ta), tantalum nitride (TaNx), titanium (Ti), titanium nitride (TiN), manganese oxide (MnOx), the like, and/or combinations thereof. The liner layer 108 may be formed by a suitable deposition technique, such as chemical vapor deposition (CVD), or the like. Due to the high temperature of the deposition process for forming the liner layer 108, the deposited liner layer 108 may react with a top portion of the semiconductor region 104 to form a silicide region 107 (or metal alloy region). In one example, when the liner layer 108 is made of titanium, the silicide region 107 may comprise titanium silicide (TiSi$_x$). At this stage, after forming the liner layer 108 in the opening OP, the top opening width WT1 is substantially equal to or greater than the bottom opening width WB1.

Referring to FIG. 1D, in a subsequent step, a conductive material layer 110 (or first metal layer 110) is formed within the opening OP and on the dielectric layer 106. For example, the conductive material layer 110 (or first metal layer 110) is formed along the top surface 106-TS of the dielectric layer 106 and along sidewalls (e.g. bottom sidewalls OP1-SW and top sidewalls OP2-SW) and the bottom surface OP-BX of the opening OP, and is formed over the liner layer 108. In some embodiments, the conductive material layer 110 (or first metal layer 110) is a seed layer. For example, the conductive material layer 110 (or first metal layer 110) include materials such as titanium (Ti), tantalum (Ta), tungsten (W), aluminum (Al), cobalt (Co), hafnium (Hf), zirconium (Zr), ruthenium (Ru), or the like, and may be formed by suitable deposition methods such as PVD, CVD, or the like.

As illustrated in FIG. 1D, the conductive material layer 110 (or first metal layer 110) has a top section 110-TS and a bottom section 110-BS. The top section 110-TS is covering the top surface 106-TS of the dielectric layer 106 and top sidewalls OP2-SW of the opening OP, and the bottom section 110-BS is covering bottom sidewalls OP2-SW and a bottom surface OP-BX of the opening OP. In some embodiments, the bottom section 110-BS has a first thickness MX1 (maximum thickness) and the top section 106-TS has a second thickness MX2 (maximum thickness). The second thickness MX2 being greater than the first thickness MX1.

In some embodiments, the top section 110-TS of the conductive material layer 110 (or first metal layer 110) includes an overhang portion 110-OH with the maximum thickness (second thickness MX2). In certain embodiments, after forming the conductive material layer 110 (or first metal layer 110) in the opening OP, the top opening width WT1 and the bottom opening width WB1 are reduced. For example, due to the presence of the overhang portion 110-OH, the top opening width WT1 is reduced to be smaller than the bottom opening width WB1. In some embodiments, if the overhang portion 110-OH is left untreated, it may be difficult to fill the opening OP in subsequent processes due to the reduced top opening width WT1.

Referring to FIG. 1E to FIG. 1G, a gradient metal removal cycle used for removing the overhang portion 110-OH will be described. In some embodiments, the gradient metal removal cycle includes a first treatment TR1 and a second treatment TR2 processes, whereby the second treatment TR2 may include etching steps ES1, ES2 (combination of dry etching and wet etching). As illustrated in FIG. 1E, a first treatment TR1 is performed on the conductive material layer 110 (or first metal layer 110) to form a first oxide layer 112 on the bottom section 110-BS and on the top section 110-TS of the conductive material layer 110. For example, the first treatment TR1 includes a conformal oxide treatment to form the first oxide layer 112 conformally on the bottom section 110-BS and on the top section 110-TS of the conductive material layer 110 (or first metal layer 110). In other words, the first oxide layer 112 may have a constant thickness along the surface of the conductive material layer 110 (or first metal layer 110) and over the overhang portion 110-OH. In some embodiments, the first oxide layer 112 is a metal oxide of the conductive material layer 110 (or first metal layer 110). For example, if the conductive material layer 110 is made of tungsten (W), then the first oxide layer 112 is tungsten oxide. In some embodiments, after the conformal oxide treatment, the surface of the conductive material layer 110 is reacted to form the first oxide layer 112.

In some embodiments, the first treatment TR1 or conformal oxide treatment includes $O_2$ plasma treatment or thermal treatment. In one embodiment, an oxygen flow is 20 standard cubic centimeter per minute (sccm) to 15,000 sccm. In certain embodiments, the oxygen flow is 50 sccm to 9,000 sccm. In some embodiments, a processing temperature is 25° C. to 250° C., and a processing time is 20 seconds to 300 seconds. In certain embodiments, the processing time is 30 seconds to 240 seconds. Furthermore, a plasma power is controlled in a range of 100 W to 5,000 W, while the pressure is controlled in a range of 500 mtorr to 30,000 mtorr. By performing the first treatment TR1 under the above conditions, the first oxide layer 112 may be formed as a conformal layer with constant thickness. At this stage, after forming the first oxide layer 112 in the opening OP over the conductive material layer 110 (or first metal layer 110), the top opening width WT1 and the bottom opening width WB1 is further reduced, whereby the top opening width WT1 is still smaller than the bottom opening width WB1.

Referring to FIG. 1F and FIG. 1G, after forming the first oxide layer 112, a second treatment TR2 is performed to remove at least portions of the conductive material layer 110 (or first metal layer 110). For example, as illustrated in FIG. 1F an etching step ES1 (first etching process) of the second treatment TR2 is performed to selectively remove the first oxide layer 112 to reveal the top section 110-TS of the conductive material layer 110 (or first metal layer 110), while the first oxide layer 112 on the bottom section 110-BS is retained. In some embodiments, a minor portion of the first oxide layer 112 may be retained on the top section 110-TS of the conductive material layer 110 (or first metal layer 110). However, at least the overhang portion 110-OH and the conductive material layer 110 (or first metal layer 110) located on the top surface 106-TS of the dielectric layer 106 are revealed.

In some embodiments, the etching step ES1 is a dry etching step that selectively removes the first oxide layer 112 located on the top section 110-TS of the conductive material layer 110. In certain embodiments, the dry etching step selectively removes the first oxide layer 112 located on the overhang portion 110-OH. The dry etching step may be performed with reaction chemicals such as $Cl_2$, $BCl_3$, $WCl_5$, $WCl_6$, MoCl, $TiCl_4$, $F_2$, $WF_6$, $NF_3$, or the like. Furthermore, the dry etching step may be performed under inert atmosphere (e.g. under argon) with a chemical (reaction chemical) flow rate of 50 sccm to 1,000 sccm, at a processing temperature of 25° C. to 550° C., and under a pressure of 500 mtorr to 30,000 mtorr. In one embodiment, when the first oxide layer 112 is made of tungsten oxide, the reaction chemical used in the etching step ES1 may be $WCl_5$. In some embodiments, due to the presence of the overhang portion 110-OH, the etching chemical (e.g. $WCl_5$) is less likely to diffuse to the bottom opening portion OP1. As such, the first oxide layer 112 on the top section 110-TS of the conductive material layer 110 (or first metal layer 110) may be selectively removed. In certain embodiments, after partially removing the first oxide layer 112, the top opening width WT1 may be slightly increased.

Referring to FIG. 1G, in a subsequent step, an etching step ES2 (second etching process) of the second treatment TR2 is performed to remove parts of the top section 110-TS of the conductive material layer 110 (or first metal layer 110). For example, the etching step ES2 selectively removes the overhang portion 110-OH, and removes the conductive material layer 110 (or first metal layer 110) located on the top surface 106-TS of the dielectric layer 106 and on the sidewalls (top sidewalls OP2-SW) of the opening OP. Furthermore, portions of the conductive material layer 110 (or first metal layer 110) located on the bottom section 110-BS and on the bottom surface OP-BX of the opening OP is retained. In some embodiments, the etching step ES2 may also remove some of the first oxide layer 112 on the bottom section 110-BS. In some embodiments, the etching step ES2 has a higher etching selectivity for a conductive material of the conductive material layer 110 than the first oxide layer 112. In other words, the etching step ES2 will remove more of the revealed conductive material layer 110 (or first metal layer 110) at the top section 110-TS as compared with the first oxide layer 112 that is covering the bottom section 110-BS.

In some embodiments, the etching step ES2 (second etching process) is a wet etching step that selectively removes the overhang portion 110-OH. For example, the wet etching step may be performed with wet chemicals such as HCl, $H_2O_2$, $DIO_3$, $NH_4OH$, $H_2SO_4$ or the like. In one exemplary embodiment, when the conductive material layer 110 is tungsten (W), and the first oxide layer 112 is tungsten oxide, the wet chemical used in the etching step ES2 may be $DIO_3$. In some embodiments, $DIO_3$ is 10 times more selective for etching tungsten as compared to tungsten oxide. In other words, when $DIO_3$ is used as a wet etching chemical, an etching rate of tungsten will be faster than the etching rate of tungsten oxide. In the exemplary embodiment, since the bottom section 110-BS of the conductive material layer 110 (or first metal layer 110) is protected by the first oxide layer 112, the etching step ES2 will selectively remove more of the top section 110-TS.

After performing the etching steps ES1, ES2 of the second treatment TR2, the bottom section 110-BS and the top section 110-TS of the conductive material layer 110 will have substantially equal thickness. For example, the first thickness MX1 (maximum thickness) of the bottom section 110-BS may be substantially equal to the second thickness MX2 (maximum thickness) of the top section 110-TS. In some embodiments, the second thickness MX2 (maximum thickness) of the top section 110-TS is slightly smaller than the first thickness MX1 (maximum thickness) of the bottom section 110-BS. According to the above embodiment, one gradient metal removal cycle including the first treatment TR1 and the second treatment TR2 (including etching steps ES1, ES2) may be completed. In some embodiments, the gradient metal removal cycle removes more of the top section 110-TS of the conductive material layer 110 (or first metal layer 110) than the bottom section 110-BS of the conductive material layer 110 (or first metal layer 110). Furthermore, after the gradient metal removal cycle, the top opening width WT1 is substantially equal to or greater than the bottom opening width WB1.

Referring to FIG. 1H, after performing the gradient metal removal cycle, an anti-reflective coating 120 (or photoresist) is formed to partially cover the conductive material layer 110 (or first metal layer 110). For example, in some embodiments, the anti-reflective coating 120 fills into the bottom opening portion OP1 of the opening OP1 to cover the bottom section 110-BS of the conductive material layer 110, while the top section 110-TS of the conductive material layer 110 is revealed. Subsequently, referring to FIG. 1I, the conductive material layer 110 (or first metal layer 110) on the top surface 106-TS of the dielectric layer 106 and on the sidewalls (top sidewalls OP2-SW) of the opening OP not covered by the anti-reflective coating 120 are removed (e.g. by a pull-back process). Furthermore, the liner layer 108 is removed to reveal the top sidewalls OP2-SW of the opening OP and the top surface 106-TS of the dielectric layer 106. In some embodiments, portions of the conductive material layer 110 and the liner layer 108 are removed through photolithography processing. Thereafter, an ashing process is performed to remove the anti-reflective coating 120 as shown in FIG. 1J.

Referring to FIG. 1K, the conductive material layer 110 (or first metal layer 110) and the liner layer 108 may be further etched so that a portion of the conductive material layer 110 (or first metal layer 110) and a portion of the liner layer 108 on the bottom sidewalls OP1-SW of the opening OP are removed. In other words, an etching process is performed to further reveal the bottom sidewalls OP1-SW of the opening OP. In some embodiments, a portion of the conductive material layer 110 (or first metal layer 110) and a portion of the liner layer 108 on the bottom surface OP-BX of the opening OP are retained. For example, after performing an etching process to remove portions of the conductive material layer 110 and the liner layer 108, a top surface of the conductive material layer 110 may be substantially aligned or coplanar with a top surface of the liner layer 108.

Referring to FIG. 1L, a first portion 122A of a second metal layer 122 (or conductive contact) is formed in the opening OP over the conductive material layer 110 (or first metal layer 110). For example, the first portion 122A is filled in the bottom opening portion OP1 of the opening OP to cover the bottom sidewalls OP1-SW. In some embodiments, the first portion 122A partially cover the bottom sidewalls OP1-SW. In some other embodiments, the first portion 122A may fully cover the bottom sidewalls OP1-SW and extends towards the top opening portion OP2. Subsequently, referring to FIG. 1M, a second portion 122B of the second metal layer 122 is formed over the first portion 122A to fill up the opening OP and to cover the top surface 106-TS of the dielectric layer 106.

Referring to FIG. 1N, after forming the second portion 122B over the first portion 122A of the second metal layer 122, a planarization process, such as a chemical mechanical planarization (CMP) process, may be performed to remove the second portion 122B that are located outside of the opening OP. After the planarization process, a top surface of the second portion 122B may be aligned or substantially coplanar with the top surface 106-TS of the dielectric layer 106. In the exemplary embodiment, the first portion 122A and the second portion 122B of the second metal layer 122 may be made of conductive materials such as copper (Cu), aluminum (Al), tungsten (W), cobalt (Co), ruthenium (Ru) alloys thereof, or the like. The second metal layer 122 (or conductive contact) may be formed on the bottom section 110-BS of the conductive material layer 110 (or first metal layer 110) through electro-plating or electro-less plating techniques to fill the opening OP. After forming the second metal layer 122 on the conductive material layer 110 (or first metal layer 110), a contact structure CS1 in accordance with some embodiments of the present disclosure is accomplished. In the exemplary embodiment, since at least one gradient metal removal cycle is performed to remove the overhang portion 110-OH of the conductive material layer 110 (or first metal layer 110), this will improve the gap filling capability of materials formed in subsequent processes. As such, the contact structure CS1 or the conductive material layer 110 (or first metal layer 110) is less likely to be damaged, and a more reliable electrical connection can be provided.

FIG. 2A to FIG. 2D are schematic sectional views of various stages in a method of fabricating a contact structure according to some other embodiments of the present disclosure. The method shown in FIG. 2A to FIG. 2D is similar to the method shown in FIG. 1A to FIG. 1N. Therefore, the same reference numerals are used to refer to the same or liked parts, and its detailed description will be omitted herein. The difference between the embodiments is in the first treatment TR1 and the second treatment TR2 processes of the gradient metal removal cycle.

Figure 2A:
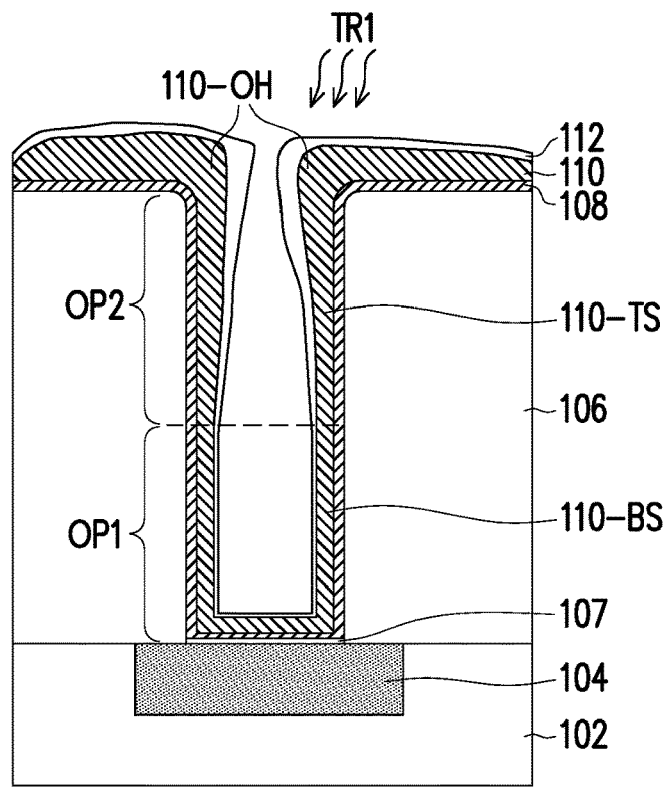
FIG. 2A to FIG. 2D are schematic sectional views of various stages in a method of fabricating a contact structure according to some other embodiments of the present disclosure.

Referring to FIG. 2A, the same method steps described in FIG. 1A to FIG. 1D may be performed to form the conductive material layer 110 (or first metal layer 110) and the liner layer 108 over the dielectric layer 106 and in the opening OP. In some embodiments, as illustrated in FIG. 2A, a first treatment TR1 is performed on the conductive material layer 110 (or first metal layer 110) to form a first oxide layer 112 on the bottom section 110-BS and on the top section 110-TS of the conductive material layer 110. For example, the first treatment TR1 includes a gradient oxide treatment that selectively form the first oxide layer 112 on the conductive material layer 110 with a thickness that decreases from the top section 110-TS to the bottom section 110-BS. In other words, the first oxide layer 112 may have a greater thickness over the top surface 106-TS of the dielectric layer 106 and on the top section 110-TS of the conductive material layer 110 (or first metal layer 110), while having a reduced thickness on the bottom section 110-BS of the conductive material layer 110 (or first metal layer 110).

In some embodiments, a greater amount of the conductive material layer 110 in the top section 110-TS is oxidized to form a metal oxide constituting the first oxide layer 112, while a smaller amount of the bottom section 100-BS of the conductive material layer 110 is oxidized (less surface modification). In some other embodiments, a portion of the bottom section 100-BS of the conductive material layer 110 is not oxidized. In other words, a surface of the conductive material layer 110 at the bottom section 100-BS may be revealed.

In some embodiments, the first treatment TR1 or gradient oxide treatment includes $O_2$ plasma treatment or thermal treatment. In one embodiment, an oxygen flow is 5 sccm to 20 sccm. In some embodiments, a processing temperature is 300° C. to 550° C., and a processing time is 20 seconds or less. In certain embodiments, the processing time is 5 seconds to 19 seconds. Furthermore, a plasma power is controlled in a range of 100 W to 5,000 W, while the pressure is controlled in a range of 500 mtorr to 30,000 mtorr. By performing the first treatment TR1 under the above conditions, the first oxide layer 112 may be formed as a gradient layer with a thickness that decreases from the top section 110-TS to the bottom section 110-BS. In the exemplary embodiment, since the first treatment TR1 is performed at a relatively high temperature (300° C. to 550° C.) and short processing times, the 02 gas is less likely to flow towards the bottom section 110-BS, while the top section 110-TS of the conductive material layer 110 (or first metal layer 110) is rapidly oxidized.

Figure 2B:
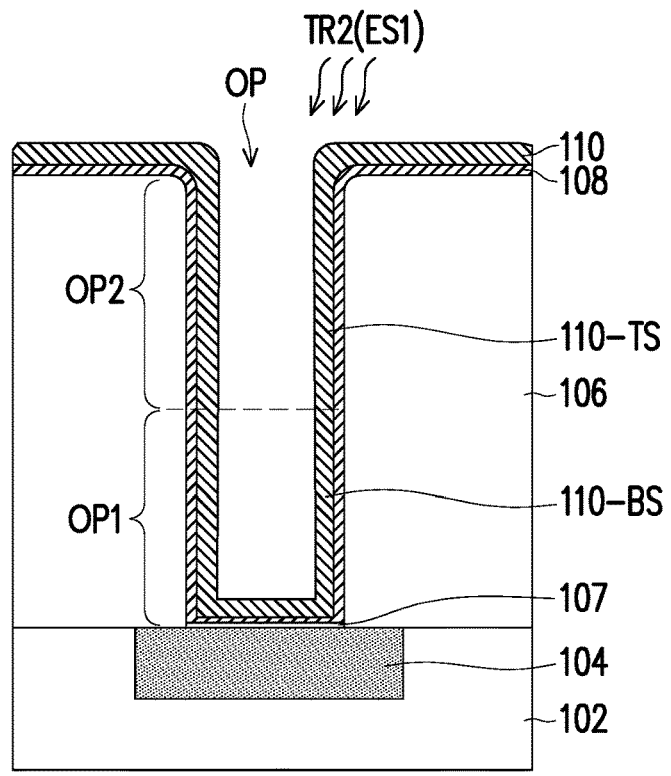

Referring to FIG. 2B, in a subsequent step, the second treatment TR2 is performed to remove the first oxide layer 112 on the top section 110-TS and the bottom section 110-BS of the conductive material layer 110 (or first metal layer 110). For example, the second treatment TR2 removes the overhang portion 110-OH, and after performing the second treatment TR2, the bottom section 110-BS and the top section 110-TS of the conductive material layer 110 (or first metal layer 110) have substantially equal thickness. In the exemplary embodiment, the second treatment TR2 includes a single etching step ES1 that removes the first oxide layer 112 on the top section 110-TS and the bottom section 110-BS of the conductive material layer 110, and may further remove parts of the bottom section 110-BS of the conductive material layer 110.

In some embodiments, the etching step ES1 is a dry etching step that selectively removes the first oxide layer 112 located on the top section 110-TS of the conductive material layer 110. The dry etching step may be performed with reaction chemicals such as $Cl_2$, $BCl_3$, $WCl_5$, $WCl_6$, $MoCl$, $TiCl_4$, $F_2$, $WF_6$, $NF_3$, or the like. Furthermore, the dry etching step may be performed under inert atmosphere (e.g. under argon) with a chemical (reaction chemical) flow rate of 50 sccm to 1,000 sccm, at a processing temperature of 25° C. to 550° C., and under a pressure of 500 mtorr to 30,000 mtorr.

In the exemplary embodiment, the etching step ES1 has a higher etching selectivity for the first oxide layer 112 than a conductive material of the conductive material layer 110. In other words, the etching step ES1 will remove more of the first oxide layer 112 as compared with any revealed conductive material layer 110 (or first metal layer 110). Since more of the top section 110-TS of the conductive material layer 110 (or first metal layer 110) is oxidized to form the first oxide layer 112, and the bottom section 110-BS of the conductive material layer 110 (or first metal layer 110) is less oxidized, the etching step ES1 will tend to remove more of the oxidized top section 110-TS. Furthermore, when the first oxide layer 112 located on the bottom section 110-BS is completely removed, the etching step ES1 will remove minor amounts of the conductive material layer 110 at the bottom section 110-BS due to a lower etching selectivity for the conductive material layer 110.

For example, in one embodiment, when the top section 110-TS is covered with a tungsten oxide layer (first oxide layer 112) and the bottom section 110-BS made of tungsten (conductive material layer 110) is revealed, the etching step ES1 (e.g. using WCl$_5$) will tend to remove the tungsten oxide layer as compared with the tungsten layer. As such, one gradient metal removal cycle including the first treatment TR1 and the second treatment TR2 (with single etching step ES1) may be completed. In some embodiments, the gradient metal removal cycle removes more of the top section 110-TS of the conductive material layer 110 (due to more oxidation) than the bottom section 110-BS of the conductive material layer 110 (due to less oxidation). Furthermore, after the gradient metal removal cycle, the top opening width WT1 is substantially equal to or greater than the bottom opening width WB1.

Figure 2C:
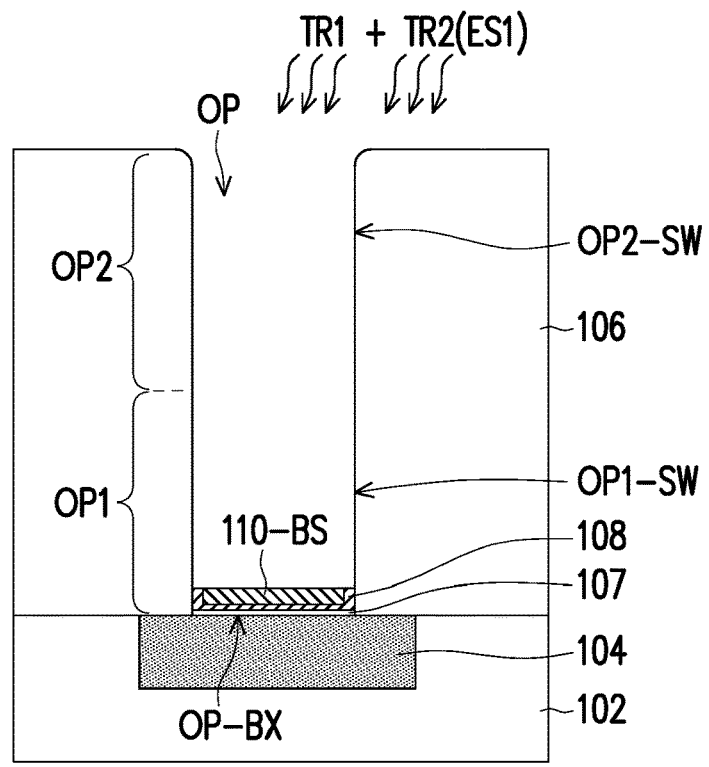

Referring to FIG. 2C, in some embodiments, the gradient metal removal cycle may be repeated. For example, the first treatment TR1 and the second treatment TR2 (single etching step ES1) may be repeated a plurality of times until the top section 110-TS of the conductive material layer 110 (or first metal layer 110) is completely removed, and a portion of the bottom section 110-BS of the conductive material layer 110 (or first metal layer 110) is retained. For example, in some embodiments, a portion of the conductive material layer 110 (or first metal layer 110) and a portion of the liner layer 108 on the bottom sidewalls OP1-SW of the opening OP are removed.

In some embodiments, the gradient metal removal cycle including the first treatment TR1 and the second treatment TR2 is repeated at least two times. In some embodiments, the gradient metal removal cycle including the first treatment TR1 and the second treatment TR2 is repeated at least three times. In some embodiments, the gradient metal removal cycle including the first treatment TR1 and the second treatment TR2 is repeated at least three times. In certain embodiments, the gradient metal removal cycle including the first treatment TR1 and the second treatment TR2 is repeated four times or more. After repeating the gradient metal removal cycle, a top surface of the conductive material layer 110 may be substantially aligned or coplanar with a top surface of the liner layer 108.

In the exemplary embodiment, since one gradient metal removal cycle removes more of the top section 110-TS of the conductive material layer 110 (due to more oxidation) than the bottom section 110-BS of the conductive material layer 110 (due to less oxidation), if the gradient metal removal cycle is repeated, the top section 110-TS of the conductive material layer 110 will be completely removed first, while a portion of the bottom section 110-BS of the conductive material layer 110 may be retained.

Figure 2D:
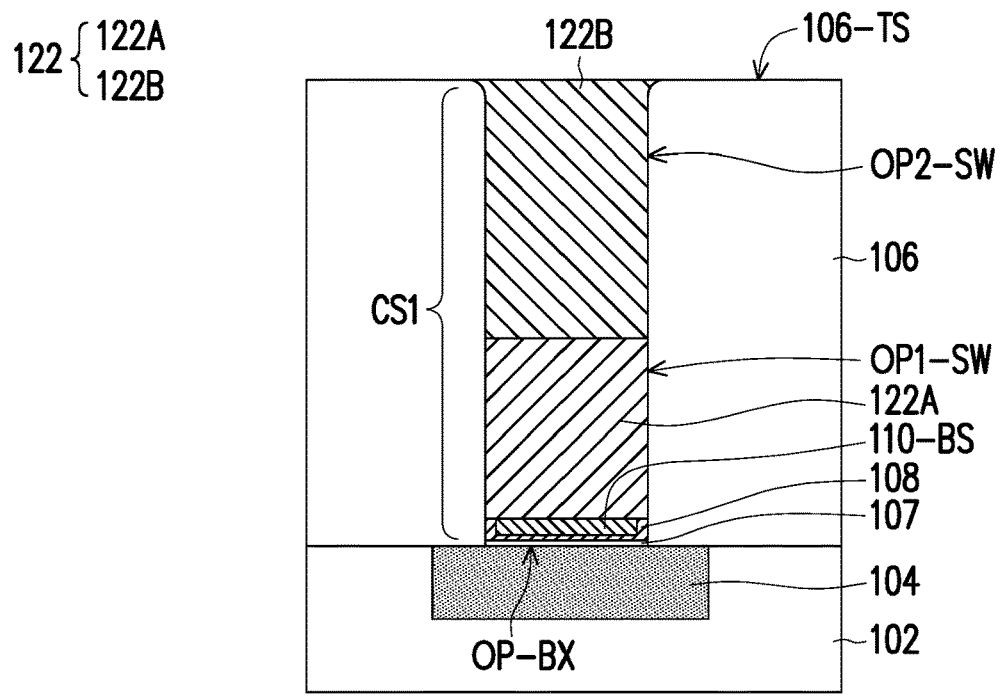

Referring to FIG. 2D, in some embodiments, the steps illustrated in FIG. 1L to FIG. 1N may be performed to form a second metal layer 122 (or conductive contact) on the bottom section 110-BS of the conductive material layer 110 (or first metal layer 110). After forming the second metal layer 122 on the conductive material layer 110 (or first metal layer 110), a contact structure CS1 in accordance with some embodiments of the present disclosure is accomplished. In the embodiment of FIG. 2A to FIG. 2D, since at least one gradient metal removal cycle is performed to remove the overhang portion 110-OH of the conductive material layer 110 (or first metal layer 110), this will improve the gap filling capability of materials formed in subsequent processes. As such, the contact structure CS1 or the conductive material layer 110 (or first metal layer 110) is less likely to be damaged, and a more reliable electrical connection can be provided.

FIG. 3A to FIG. 3D are schematic sectional views of various stages in a method of fabricating a contact structure according to some other embodiments of the present disclosure. The method shown in FIG. 3A to FIG. 3D is similar to the method shown in FIG. 1A to FIG. 1N. Therefore, the same reference numerals are used to refer to the same or liked parts, and its detailed description will be omitted herein. The difference between the embodiments is in the first treatment TR1 and the second treatment TR2 processes of the gradient metal removal cycle.

Figure 3A:
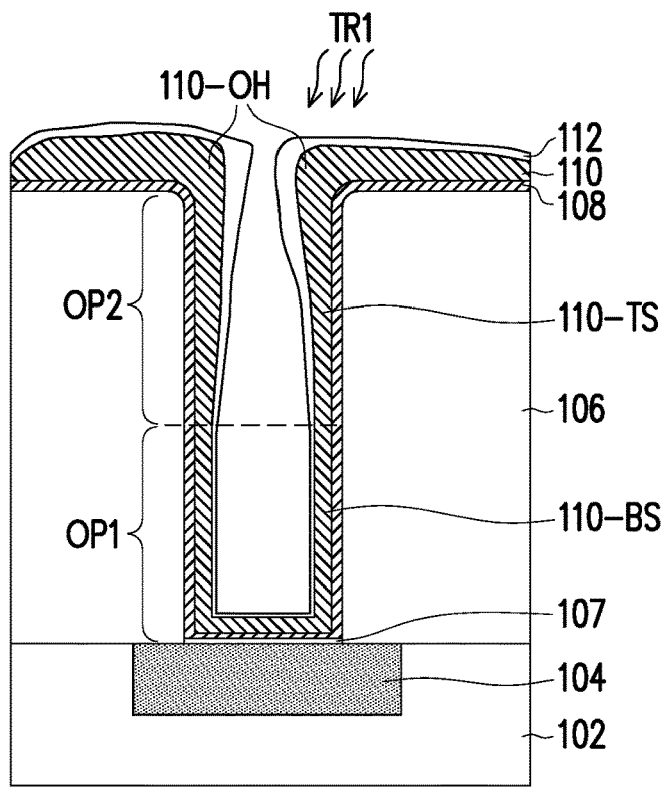
FIG. 3A to FIG. 3D are schematic sectional views of various stages in a method of fabricating a contact structure according to some other embodiments of the present disclosure.

Referring to FIG. 3A, the same method steps described in FIG. 1A to FIG. 1D may be performed to form the conductive material layer 110 (or first metal layer 110) and the liner layer 108 over the dielectric layer 106 and in the opening OP. In some embodiments, as illustrated in FIG. 3A, a first treatment TR1 is performed on the conductive material layer 110 (or first metal layer 110) to form a first oxide layer 112 on the bottom section 110-BS and on the top section 110-TS of the conductive material layer 110. For example, the first treatment TR1 includes a gradient oxide treatment that selectively form the first oxide layer 112 on the conductive material layer 110 with a thickness that decreases from the top section 110-TS to the bottom section 110-BS. In other words, the first oxide layer 112 may have a greater thickness over the top surface 106-TS of the dielectric layer 106 and on the top section 110-TS of the conductive material layer 110 (or first metal layer 110), while having a reduced thickness on the bottom section 110-BS of the conductive material layer 110 (or first metal layer 110).

In some embodiments, a greater amount of the conductive material layer 110 in the top section 110-TS is oxidized to form a metal oxide constituting the first oxide layer 112, while a smaller amount of the bottom section 100-BS of the conductive material layer 110 is oxidized (less surface modification). In some other embodiments, a portion of the bottom section 100-BS of the conductive material layer 110 is not oxidized. In other words, a surface of the conductive material layer 110 at the bottom section 100-BS may be revealed.

In some embodiments, the first treatment TR1 or gradient oxide treatment includes O$_2$ plasma treatment or thermal treatment. In one embodiment, an oxygen flow is 5 sccm to 20 sccm. In some embodiments, a processing temperature is 300° C. to 550° C., and a processing time is 20 seconds or less. In certain embodiments, the processing time is 5 seconds to 19 seconds. Furthermore, a plasma power is controlled in a range of 100 W to 5,000 W, while the pressure is controlled in a range of 500 mtorr to 30,000 mtorr. By performing the first treatment TR1 under the above conditions, the first oxide layer 112 may be formed as a gradient layer with a thickness that decreases from the top section 110-TS to the bottom section 110-BS.

Figure 3B:
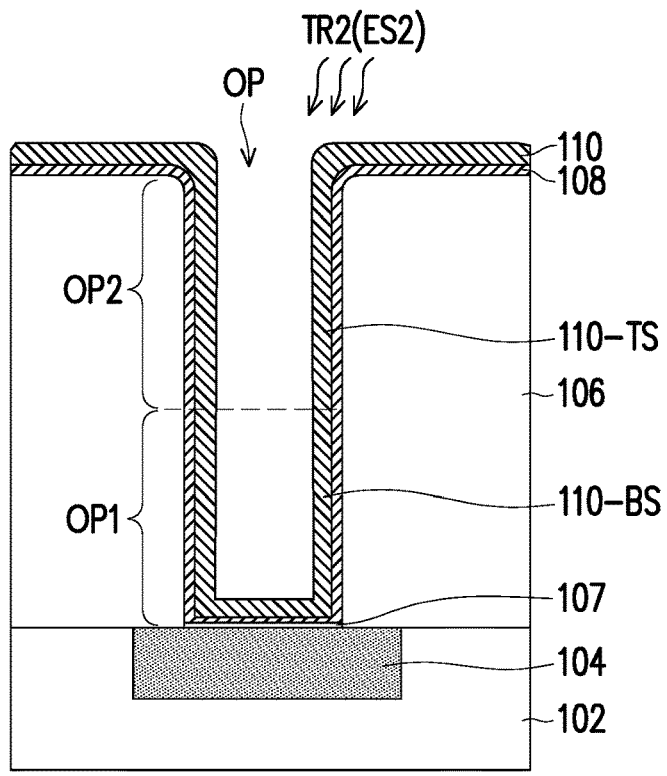

Referring to FIG. 3B, in a subsequent step, the second treatment TR2 is performed to remove the first oxide layer 112 on the top section 110-TS and the bottom section 110-BS of the conductive material layer 110 (or first metal layer 110). For example, the second treatment TR2 removes the overhang portion 110-OH, and after performing the second treatment TR2, the bottom section 110-BS and the top section 110-TS of the conductive material layer 110 (or first metal layer 110) have substantially equal thickness. In the exemplary embodiment, the second treatment TR2 includes a single etching step ES2 that removes the first oxide layer 112 on the top section 110-TS and the bottom section 110-BS of the conductive material layer 110, and may further remove parts of the bottom section 110-BS of the conductive material layer 110.

In some embodiments, the etching step ES2 is a wet etching step that selectively removes the first oxide layer 112 located on the top section 110-TS of the conductive material layer 110. For example, the wet etching step may be performed with wet chemicals such as HCl, $H_2O_2$, $DIO_3$, $NH_4OH$, $H_2SO_4$ or the like. In one exemplary embodiment, when the conductive material layer 110 is tungsten (W), and the first oxide layer 112 is tungsten oxide, the wet chemical used in the etching step ES2 may be $NH_4OH$. In some embodiments, $NH_4OH$ is 100 times more selective for etching tungsten oxide as compared to tungsten. In other words, when $NH_4OH$ is used as a wet etching chemical, an etching rate of tungsten oxide will be faster than the etching rate of tungsten.

In the exemplary embodiment, the etching step ES2 has a higher etching selectivity for the first oxide layer 112 than a conductive material of the conductive material layer 110. In other words, the etching step ES2 will remove more of the first oxide layer 112 as compared with any revealed conductive material layer 110 (or first metal layer 110). Since more of the top section 110-TS of the conductive material layer 110 (or first metal layer 110) is oxidized to form the first oxide layer 112, and the bottom section 110-BS of the conductive material layer 110 (or first metal layer 110) is less oxidized, the etching step ES2 will tend to remove more of the oxidized top section 110-TS. Furthermore, when the first oxide layer 112 located on the bottom section 110-BS is completely removed, the etching step ES2 will remove minor amounts of the conductive material layer 110 at the bottom section 110-BS due to a lower etching selectivity for the conductive material layer 110.

Based on the above, one gradient metal removal cycle including the first treatment TR1 and the second treatment TR2 (with single etching step ES2) may be completed. In some embodiments, the gradient metal removal cycle removes more of the top section 110-TS of the conductive material layer 110 (due to more oxidation) than the bottom section 110-BS of the conductive material layer 110 (due to less oxidation). Furthermore, after the gradient metal removal cycle, the top opening width WT1 is substantially equal to or greater than the bottom opening width WB1.

Figure 3C:
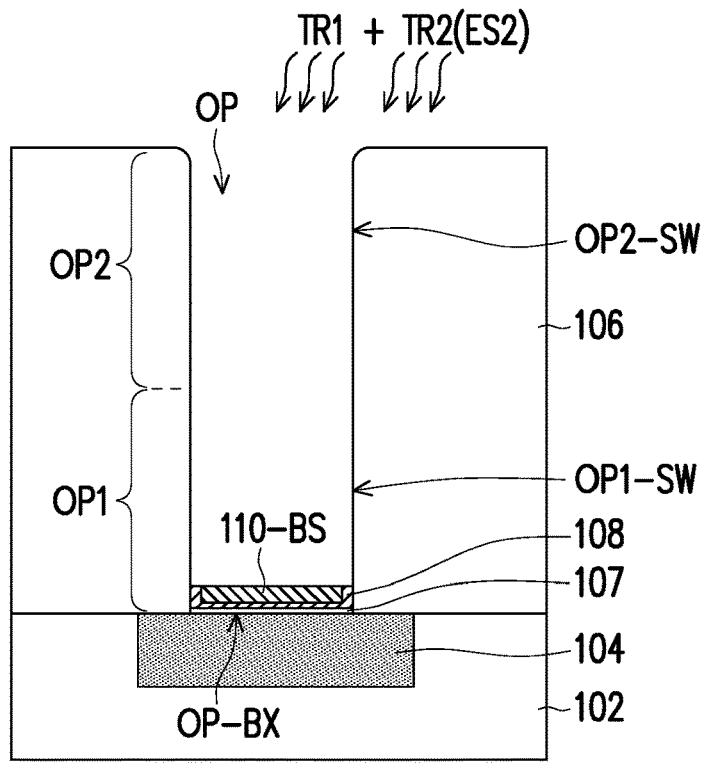

Referring to FIG. 3C, in some embodiments, the gradient metal removal cycle may be repeated. For example, the first treatment TR1 and the second treatment TR2 (single etching step ES2) may be repeated a plurality of times until the top section 110-TS of the conductive material layer 110 (or first metal layer 110) is completely removed, and a portion of the bottom section 110-BS of the conductive material layer 110 (or first metal layer 110) is retained. For example, in some embodiments, a portion of the conductive material layer 110 (or first metal layer 110) and a portion of the liner layer 108 on the bottom sidewalls OP1-SW of the opening OP are removed. In some embodiments, the gradient metal removal cycle may be repeated as described above for FIG. 2C. After repeating the gradient metal removal cycle, a top surface of the conductive material layer 110 may be substantially aligned or coplanar with a top surface of the liner layer 108.

Figure 3D:
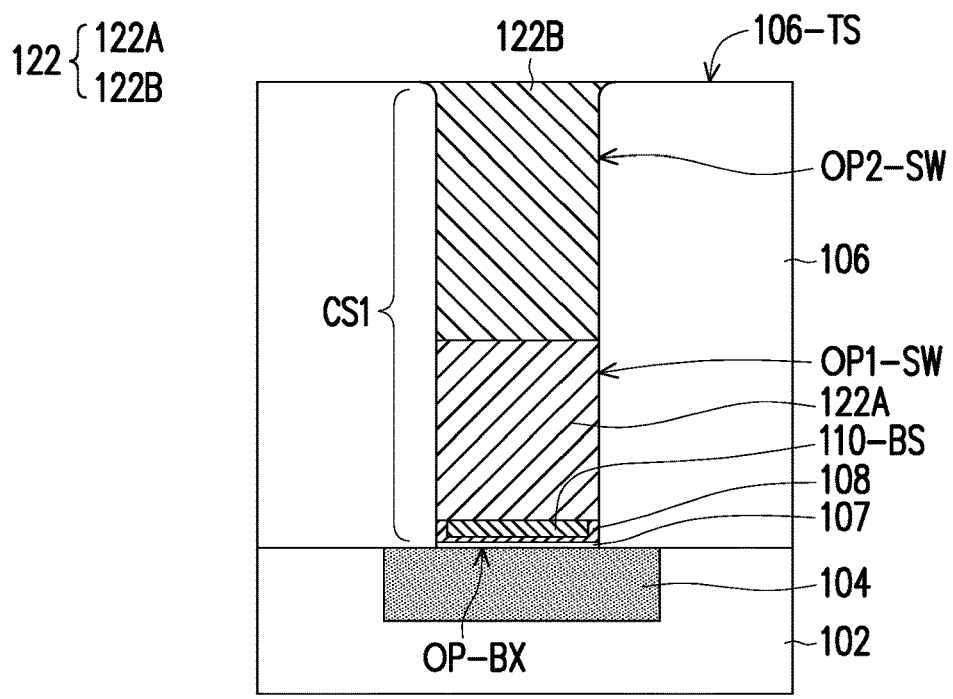

Referring to FIG. 3D, in some embodiments, the steps illustrated in FIG. 1L to FIG. 1N may be performed to form a second metal layer 122 (or conductive contact) on the bottom section 110-BS of the conductive material layer 110 (or first metal layer 110). After forming the second metal layer 122 on the conductive material layer 110 (or first metal layer 110), a contact structure CS1 in accordance with some embodiments of the present disclosure is accomplished. In the embodiment of FIG. 3A to FIG. 3D, since at least one gradient metal removal cycle is performed to remove the overhang portion 110-OH of the conductive material layer 110 (or first metal layer 110), this will improve the gap filling capability of materials formed in subsequent processes. As such, the contact structure CS1 or the conductive material layer 110 (or first metal layer 110) is less likely to be damaged, and a more reliable electrical connection can be provided.

Figure 4:
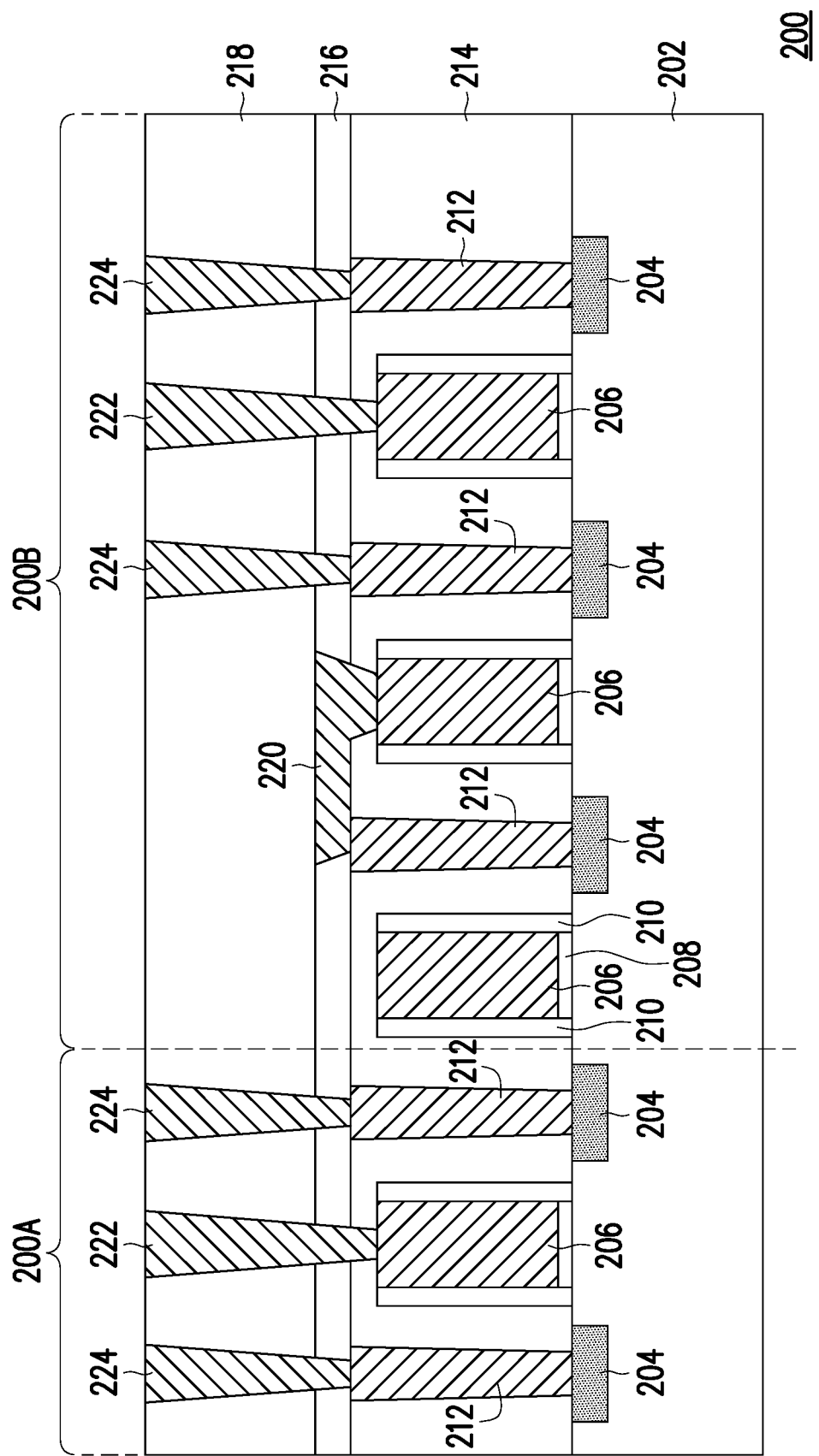
FIG. 4 is a schematic sectional view of a semiconductor device in accordance with some embodiments of the present disclosure.

FIG. 4 is a schematic sectional view of a semiconductor device in accordance with some embodiments of the present disclosure. As illustrated in FIG. 4, the semiconductor device 200 includes a substrate 202 having a plurality of semiconductor regions 204. The substrate 202 and the semiconductor regions 204 may be similar to the substrate 102 and the semiconductor region 104 described above, thus its details will not be repeated herein. In some embodiments, a plurality of transistors may be disposed over the substrate 202. For example, the transistors may include a gate line 206 disposed on a gate dielectric layer 208, and sidewall spacers 210 are covering sidewalls of the gate line 206 and the gate dielectric layer 208. In some embodiments, each transistor further includes contact structures 212 located at two sides of the gate line 206. For example, the contact structures 212 are located on the semiconductor regions 204 for out routing the transistors. In some embodiments, the contact structures 212 may be formed by any of the methods described for forming the contact structures CS1 as illustrated in FIG. 1A to FIG. 3D. Furthermore, the gate line 206, the gate dielectric layer 208, the sidewall spacers 210 and the contact structures 212 are laterally surrounded by a dielectric layer 214.

As further illustrated in FIG. 4, in some embodiments, the transistors described above are located in a logic region 200A or in a memory region 200B (such as a SRAM memory region). In some embodiments, an etch stop layer 216 and a dielectric layer 218 are sequentially disposed over the dielectric layer 214 in the logic region 200A and the memory region 200B. In the memory region 200B, a butted contact 220 may be disposed in the etch stop layer 216, and electrically connects the contact structure 212 to the gate line 206. Furthermore, gate contacts 222 may be laterally surrounded by the etch stop layer 216 and the dielectric layer 218, whereby the gate contacts 222 are electrically connected to the gate lines 206 of the transistors in the logic region 200A and the memory region 200B. In addition, source/drain contacts 224 may be laterally surrounded by the etch stop layer 216 and the dielectric layer 218, whereby the source/drain contacts 224 are electrically connected to the contact structures 212 of the transistors in the logic region 200A and the memory region 200B.

In the exemplary embodiment, the butted contact 220, the gate contacts 222 and the source/drain contacts 224 are contact structures that may be formed by any of the methods described for forming the contact structures CS1 as illustrated in FIG. 1A to FIG. 3D. The difference being that the butted contact 220, the gate contacts 222 and the source/drain contacts 224 are not directly connected to the semiconductor region 204. Based on the embodiments above, it is noted that the methods described for forming the contact structures CS1 as illustrated in FIG. 1A to FIG. 3D, may be applied for forming contact structures at different levels of the semiconductor device. For example, the contact structures CS1 formed in FIG. 1A to FIG. 3D may be indirectly connected to the semiconductor region 104, or connected to other conductive elements.

Figure 5A:
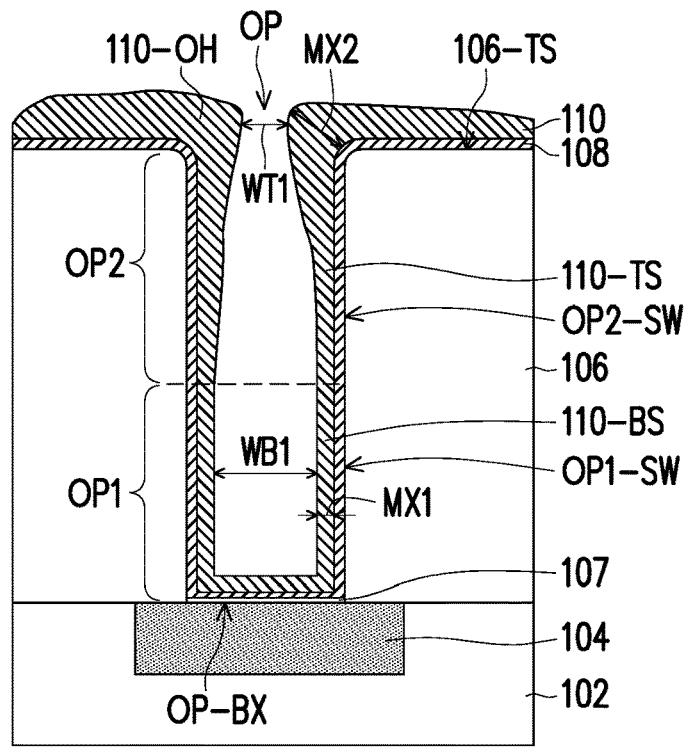
FIG. 5A to FIG. 5F are schematic sectional views of various stages in a method of fabricating a contact structure according to some comparative embodiments of the present disclosure.

FIG. 5A to FIG. 5F are schematic sectional views of various stages in a method of fabricating a contact structure according to some comparative embodiments of the present disclosure. In the comparative embodiment, the same reference numerals with the previous embodiments are used to refer to the same or liked parts, and its details will be omitted herein. Referring to FIG. 5A, the same method steps described in FIG. 1A to FIG. 1D may be performed to form the conductive material layer 110 (or first metal layer 110) and the liner layer 108 over the dielectric layer 106 and in the opening OP. In other words, the conductive material layer 110 (or first metal layer 110) includes an overhang portion 110-OH.

Figure 5B:
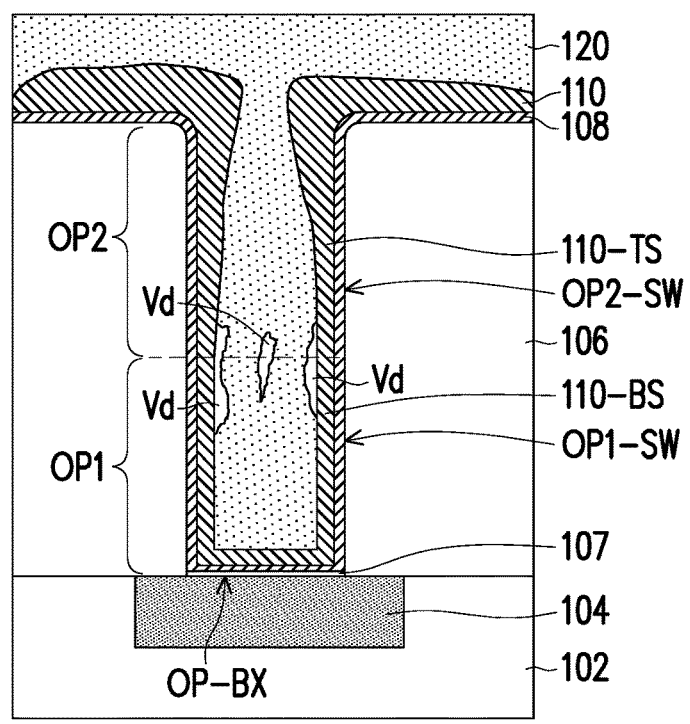
Figure 5C:
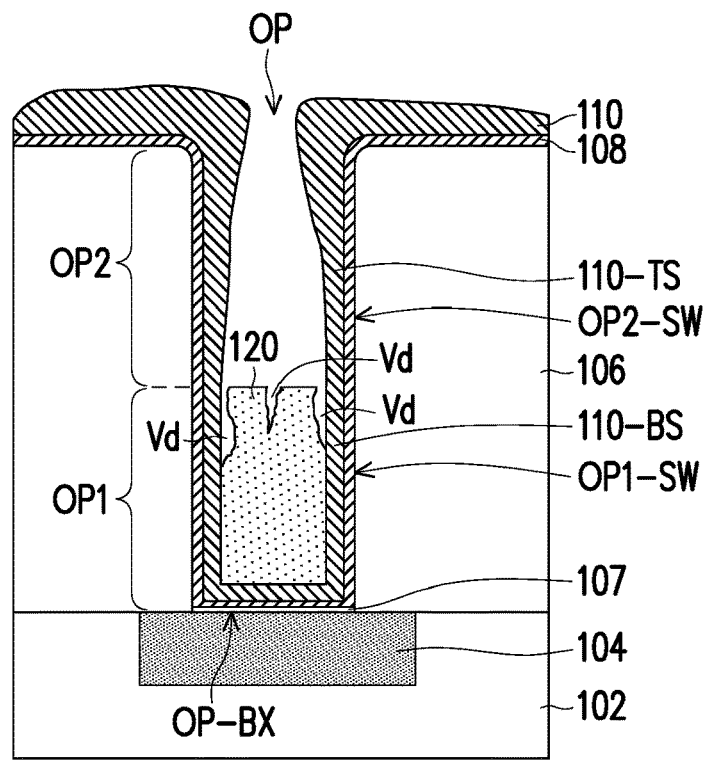

Referring to FIG. 5B, in a subsequent step, an anti-reflective coating 120 (or photoresist) is filled in the opening OP over the conductive material layer 110 (or first metal layer 110). Due to the presence of the overhang portion 110-OH, the opening OP has a reduced top opening width WT1. As such, the filling of the anti-reflective coating 120 in the opening OP becomes difficult, and voids Vd will be formed in the anti-reflective coating 120 due to improper filling. As such, referring to FIG. 5C, when the anti-reflective coating 120 is etched to form a mask pattern, a desired pattern cannot be achieved, and the voids Vd may exist on the surface of the etched anti-reflective coating 120.

Figure 5D:
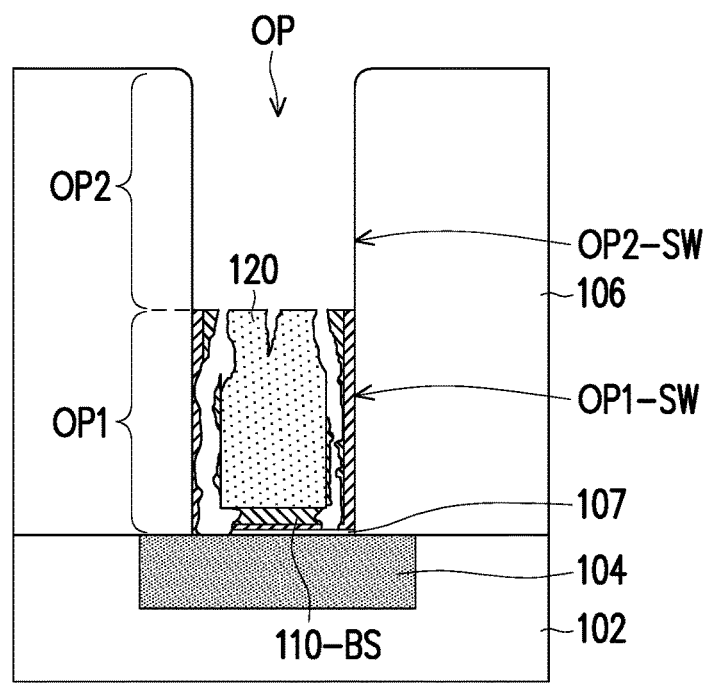
Figure 5E:
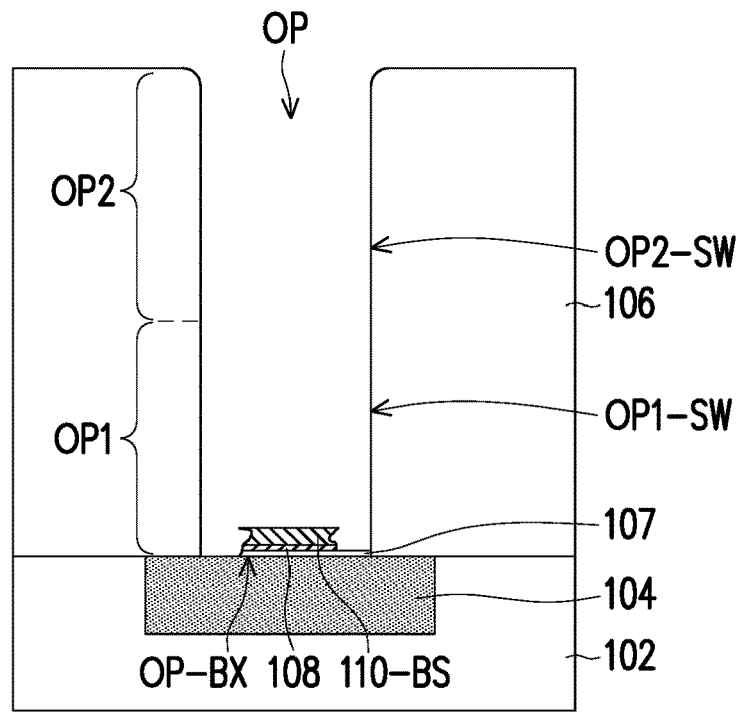
Figure 5F:
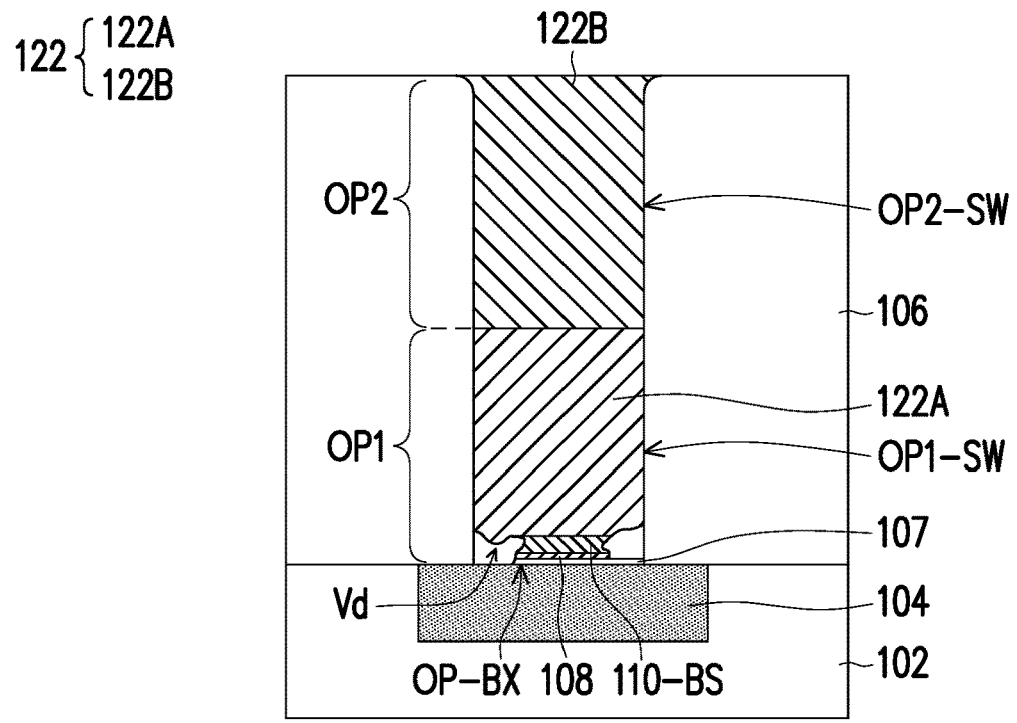

Referring to FIG. 5D, when using the damaged anti-reflective coating 120 to perform a pull-back process of the conductive material layer 110 (or first metal layer 110), the reaction chemical used in the etching steps may leak through the voids Vd of the anti-reflective coating 120 and cause damage to the bottom section 110-BS of the conductive material layer 110 (or first metal layer 110). Referring to FIG. 5E, upon removal of the anti-reflective coating 120, and further etching of the conductive material layer 110 (or first metal layer 110) and the liner layer 108, a portion of the bottom section 110-BS of the conductive material layer 110 (or first metal layer 110) and a portion of the liner layer 108 on the bottom surface OP-BX of the opening OP are retained. However, the remaining bottom section 110-BS and the liner layer 108 are damage, and a surface of the semiconductor region 104 may be exposed. As such, referring to FIG. 5F, when the second metal layer 122 is formed on the conductive material layer 110 (or first metal layer 110) to form a contact structure CS1, the constant structure CS1 may have a damaged bottom profile, and voids Vd may still exist. Therefore, the formed constant structure CS1 may have increased resistance, and the reliability of the electrical connection is reduced.

According to the above embodiments, if a gradient metal removal cycle is not performed to remove the overhang portion, conductive elements cannot be reliably filled into the openings in the subsequent steps. On the other hand, in the exemplary embodiments, since at least one gradient metal removal cycle is performed to remove the overhang portion of the conductive material layer (or first metal layer), this will improve the gap filling capability of materials formed in subsequent processes. As such, the contact structure or the conductive material layer is less likely to be damaged, and a more reliable electrical connection can be provided. The method is also suitable for forming contact structures or contact plugs at different levels (back-end/front-end) of a semiconductor device.

In accordance with some embodiments of the present disclosure, a method of fabricating a contact structure is described. The method includes the following steps. An opening is formed in a dielectric layer. A conductive material layer is formed within the opening and on the dielectric layer, wherein the conductive material layer includes a bottom section having a first thickness and a top section having a second thickness, the second thickness is greater than the first thickness. A first treatment is performed on the conductive material layer to form a first oxide layer on the bottom section and on the top section of the conductive material layer. A second treatment is performed to remove at least portions of the first oxide layer and at least portions of the conductive material layer, wherein after performing the second treatment, the bottom section and the top section of the conductive material layer have substantially equal thickness.

In accordance with some other embodiments of the present disclosure, a method of fabricating a contact structure is described. The method includes the following steps. A substrate having a semiconductor region is provided. A dielectric layer is formed on the substrate, and the dielectric layer is patterned to form an opening revealing the semiconductor region. A first metal layer is formed along a top surface of the dielectric layer and along sidewalls and a bottom surface of the opening, wherein the first metal layer has an overhang portion. An oxide treatment is performed on the first metal layer to form a metal oxide of the first metal layer along a surface of the first metal layer and on the overhang portion. An etching process is performed to remove the metal oxide and the overhang portion of the first metal layer. The first metal layer on the top surface of the dielectric layer and on the sidewalls of the opening is removed, while a portion of the first metal layer on the bottom surface of the opening is retained. A second metal layer is formed in the opening over the portion of the first metal layer.

In accordance with yet another embodiment of the present disclosure, a method of fabricating a contact structure is described. The method includes the following steps. An opening is formed in a dielectric layer, wherein the opening has a top opening width and a bottom opening width. The top opening width and the bottom opening width are reduced by forming a first metal layer over the dielectric layer and into the opening, wherein the first metal layer has a top section and a bottom section, the top section is covering a top surface of the dielectric layer and top sidewalls of the opening, and the bottom section is covering bottom sidewalls and a bottom surface of the opening, and after forming the first metal layer, the top opening width is reduced to be smaller than the bottom opening width. A gradient metal removal cycle is performed by removing portions of the first metal layer, wherein the gradient metal removal cycle removes more of the top section of the first metal layer than the bottom section of the first metal layer, and after the gradient metal removal cycle, the top opening width is substantially equal to or greater than the bottom opening width. A first portion of a second metal layer is formed in the opening. A second portion of the second metal layer is formed over the first portion to fill up the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a contact structure, comprising:
    forming an opening in a dielectric layer;
    forming a conductive material layer within the opening and on the dielectric layer, wherein the conductive material layer comprises a bottom section having a first thickness and a top section having a second thickness, the second thickness is greater than the first thickness;
    performing a first treatment on the conductive material layer to form a first oxide layer on the bottom section and on the top section of the conductive material layer; and
    performing a second treatment to remove at least portions of the first oxide layer and at least portions of the conductive material layer, wherein after performing the second treatment, the bottom section and the top section of the conductive material layer have substantially equal thickness.

2. The method according to claim 1, wherein the first treatment comprises a conformal oxide treatment to form the first oxide layer conformally on the bottom section and on the top section of the conductive material layer.

3. The method according to claim 2, wherein the second treatment comprises:
    a first etching process that selectively removes the first oxide layer to reveal the top section of the conductive material layer, while the first oxide layer on the bottom section is retained, and
    a second etching process that removes parts of the top section of the conductive material layer, and removes the first oxide layer on the bottom section, wherein the second etching process has a higher etching selectivity for a conductive material of the conductive material layer than the first oxide layer.

4. The method according to claim 1, wherein the first treatment comprises a gradient oxide treatment that selectively form the first oxide layer on the conductive material layer with a thickness that decreases from the top section to the bottom section.

5. The method according to claim 4, wherein the second treatment comprises an etching process that removes the first oxide layer on the top section and the bottom section of the conductive material layer, and further removes parts of the bottom section of the conductive material layer, and wherein the etching process has a higher etching selectivity for the first oxide layer than a conductive material of the conductive material layer.

6. The method according to claim 1, further comprising repeating the first treatment and the second treatment a plurality of times until the top section of the conductive material layer is completely removed, and a portion of the bottom section of the conductive material layer is retained.

7. The method according to claim 1, further comprising forming a conductive contact filling up the opening of the dielectric layer.

8. A method, comprising:
    providing a substrate have a semiconductor region;
    forming a dielectric layer on the substrate, and patterning the dielectric layer to form an opening revealing the semiconductor region;
    forming a first metal layer along a top surface of the dielectric layer and along sidewalls and a bottom surface of the opening, wherein the first metal layer has an overhang portion;
    performing an oxide treatment on the first metal layer to form a metal oxide of the first metal layer along a surface of the first metal layer and on the overhang portion;
    performing an etching process to remove the metal oxide and the overhang portion of the first metal layer;
    removing the first metal layer on the top surface of the dielectric layer and on the sidewalls of the opening, while retaining a portion of the first metal layer on the bottom surface of the opening; and
    forming a second metal layer in the opening over the portion of the first metal layer.

9. The method according to claim 8, further comprising forming a liner layer in the opening prior to forming the first metal layer, and forming the first metal layer on the liner layer.

10. The method according to claim 8, wherein the etching process comprises a dry etching step for removing the metal oxide on the overhang portion, and a wet etching step for removing the overhang portion.

11. The method according to claim 8, wherein the etching process comprises a dry etching step or a wet etching step for removing the metal oxide along with the overhang portion.

12. The method according to claim 11, wherein the dry etching step comprises using $WCl_5$ for dry etching, and the wet etching step comprises using $NH_4OH$ for wet etching.

13. The method according to claim 8, wherein the oxide treatment comprises $O_2$ plasma treatment with an oxygen flow of 5 sccm to 20 sccm, a processing time of 20 seconds or less, and a processing temperature of 300° C. to 550° C.

14. The method according to claim 8, wherein the first metal layer is tungsten, and the metal oxide is tungsten oxide.

15. The method according to claim 8, wherein after performing the etching process to remove the metal oxide and the overhang portion of the first metal layer, an anti-reflective coating is formed to partially cover the first metal layer, and wherein the first metal layer on the top surface of the dielectric layer and on the sidewalls of the opening not covered by the anti-reflective coating are removed.

* * * * *